United States Patent
Lu et al.

(10) Patent No.: US 6,554,898 B2
(45) Date of Patent: Apr. 29, 2003

(54) CRYSTAL PULLER FOR GROWING MONOCRYSTALLINE SILICON INGOTS

(75) Inventors: Zheng Lu, St. Charles, MO (US); Mohsen Banan, Grover, MO (US); Ying Tao, St. Peters, MO (US); Lee Ferry, St. Charles, MO (US); Carl F. Cherko, St. Charles, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 10/254,945

(22) Filed: Sep. 25, 2002

(65) Prior Publication Data

US 2003/0024473 A1 Feb. 6, 2003

Related U.S. Application Data

(62) Division of application No. 09/892,002, filed on Jun. 26, 2001.

(51) Int. Cl.[7] .............................................. C30B 35/00
(52) U.S. Cl. ..................... 117/217; 117/200; 117/204; 117/208
(58) Field of Search ................. 117/200, 204, 117/208, 217

(56) References Cited

U.S. PATENT DOCUMENTS

| | | | | |
|---|---|---|---|---|
| 4,597,949 A | * | 7/1986 | Jasinski et al. | 422/249 |
| 4,604,262 A | * | 8/1986 | Nishizawa | |
| 4,783,235 A | * | 11/1988 | Morioka et al. | |
| 4,857,278 A | * | 8/1989 | Gevelber et al. | 422/249 |
| 4,863,554 A | * | 9/1989 | Kawasaki et al. | |
| 4,963,334 A | * | 10/1990 | Ahern et al. | 422/249 |
| 4,973,377 A | | 11/1990 | Katsuoka et al. | |
| 4,981,549 A | | 1/1991 | Yamashita et al. | |
| 5,248,378 A | | 9/1993 | Oda et al. | |

(List continued on next page.)

FOREIGN PATENT DOCUMENTS

| | | |
|---|---|---|
| EP | 0 504 837 A2 | 9/1992 |
| EP | 0 716 168 A1 | 6/1996 |
| EP | 0 823 497 A1 | 2/1998 |
| JP | 58120591 | 7/1983 |
| JP | 61201692 | 9/1986 |
| JP | 03093700 | 4/1991 |
| JP | 05043385 | 2/1993 |
| JP | 06087686 | 3/1994 |
| JP | 06092780 | 4/1994 |
| JP | 8012493 | 1/1996 |
| JP | 10139600 | 5/1998 |

OTHER PUBLICATIONS

Hourai, et al., Oxygen Precipitation Behavior in Silicon During Czochralski Crystal Growth, Silicon Technology R&D Center, Japan.

(List continued on next page.)

Primary Examiner—Robert Kunemund
Assistant Examiner—Matthew A. Anderson
(74) Attorney, Agent, or Firm—Senniger, Powers, Leavitt & Roedel

(57) ABSTRACT

A crystal puller for growing monocrystalline silicon ingots includes first and second electrical resistance heaters in the crystal puller in longitudinal, closely spaced relationship with each other to radiate heat toward the ingot as the ingot is pulled upward within the housing. An adapter mounting the heaters may also be provided for adapting existing crystal pullers to incorporate the heaters.

8 Claims, 8 Drawing Sheets

U.S. PATENT DOCUMENTS

| | | |
|---|---|---|
| 5,443,034 A | 8/1995 | Everts |
| 5,575,847 A | 11/1996 | Kuramochi et al. |
| 5,667,584 A | 9/1997 | Takano et al. |
| 5,683,505 A | 11/1997 | Kuramochi et al. |
| 5,779,791 A | 7/1998 | Korb et al. |
| 5,824,149 A * | 10/1998 | Li .................. 117/14 |
| 5,840,120 A | 11/1998 | Kim et al. |
| 5,853,480 A | 12/1998 | Kubota et al. |
| 5,935,326 A | 8/1999 | Kotooka et al. |
| 5,968,262 A | 10/1999 | Saishouji et al. |
| 5,968,264 A | 10/1999 | Iida et al. |
| 6,007,625 A | 12/1999 | Tomioka et al. |
| 6,071,337 A | 6/2000 | Sakurada et al. |
| 6,093,913 A * | 7/2000 | Schrenker et al. ......... 219/424 |
| 6,146,459 A | 11/2000 | Park |
| 6,285,011 B1 * | 9/2001 | Cherko ................ 219/426 |
| 6,423,285 B1 | 7/2002 | Itoi et al. |

OTHER PUBLICATIONS

Puzanov, et al., Formation of the Bands of Anomalous Oxygen Precipitation in Czochralski–grown Si crystals, Journal of Crystal Growth, 1994, pp. 642–652, vol. 137, Moscow.

Wolf, et al., Silicon: Single Crystal Growth and Wafer Preparation, Silicon Processing for the VLSI Era, 1986, pp. 1–35, vol. 1, Lattice Press, Sunset Beach, California.

* cited by examiner

CRYSTAL PULLER FOR GROWING MONOCRYSTALLINE SILICON INGOTS

CROSS-REFERENCE TO RELATED APPLICATIONS

This application is a divisional of co-pending U.S. patent application No. 09/892,002 filed Jun. 26, 2001, still pending. The entire text of U.S. patent application No. 09/892,002 is hereby incorporated herein by reference.

BACKGROUND OF THE INVENTION

The present invention relates generally to crystal growing apparatus used in growing monocrystalline silicon ingots, and more particularly to a heater assembly for use in such a crystal growing apparatus.

Single crystal silicon, which is the starting material for most semiconductor electronic component fabrication, is commonly prepared by the so-called Czochralski ("Cz") method. The growth of the crystal is most commonly carried out in a crystal pulling furnace. In this method, polycrystalline silicon ("polysilicon") is charged to a crucible and melted by a heater surrounding the outer surface of the crucible side wall. A seed crystal is brought into contact with the molten silicon and a single crystal ingot is grown by slow extraction via a crystal puller. After formation of a neck is complete, the diameter of the crystal ingot is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process, the crystal diameter must be reduced gradually to form an end-cone. Typically, the end-cone is formed by increasing the pull rate and heat supplied to the crucible. When the diameter becomes small enough, the ingot is then separated from the melt.

It is now recognized that a number of defects in single crystal silicon form in the growth chamber as the ingot cools from the temperature of solidification. More specifically, as the ingot cools intrinsic point defects, such as crystal lattice vacancies or silicon self-interstitials, remain soluble in the silicon lattice until some threshold temperature is reached, below which the given concentration of intrinsic point defects becomes critically supersaturated. Upon cooling to below this threshold temperature, a reaction or agglomeration event occurs, resulting in the formation of agglomerated intrinsic point defects.

The type and initial concentration of these point defects in the silicon are determined as the ingot cools from the temperature of solidification (i.e., about 1410° C.) to a temperature greater than about 1300° C. (i.e., about 1325° C., 1350° C. or more); that is, the type and initial concentration of these defects are controlled by the ratio $v/G_0$, where v is the growth velocity and $G_0$ is the average axial temperature gradient over this temperature range. Accordingly, process conditions, such as growth rate (which affect v), as well as hot zone configurations (which affect $G_0$), can be controlled to determine whether the intrinsic point defects within the single crystal silicon will be predominantly vacancies (where $v/G_0$ is generally greater than the critical value) or self-interstitials (where $v/G_0$ is generally less than the critical value).

Defects associated with the agglomeration of crystal lattice vacancies, or vacancy intrinsic point defects, include such observable crystal defects as D-defects, Flow Pattern Defects (FPDs), Gate Oxide Integrity (GOI) Defects, Crystal Originated Particle (COP) Defects, and crystal originated Light Point Defects (LPDs), as well as certain classes of bulk defects observed by infrared light scattering techniques (such as Scanning Infrared Microscopy and Laser Scanning Tomography).

Also present in regions of excess vacancies, or regions where some concentration of free vacancies are present but where agglomeration has not occurred, are defects which act as the nuclei for the formation of oxidation induced stacking faults (OISF). It is speculated that this particular defect, generally formed proximate the boundary between interstitial and vacancy dominated material, is a high temperature nucleated oxygen precipitate catalyzed by the presence of excess vacancies; that is, it is speculated that this defect results from an interaction between oxygen and "free" vacancies in a region near the V/I boundary.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

Agglomerated defect formation generally occurs in two steps; first, defect "nucleation" occurs, which is the result of the intrinsic point defects being supersaturated at a given temperature. Once this "nucleation threshold" temperature is reached, intrinsic point defects agglomerate. The intrinsic point defects will continue to diffuse through the silicon lattice as long as the temperature of the portion of the ingot in which they are present remains above a second threshold temperature (i.e., a "diffusivity threshold"), below which intrinsic point defects are no longer mobile within commercially practical periods of time. While the ingot remains above this temperature, vacancy or interstitial intrinsic point defects diffuse through the crystal lattice to sites where agglomerated vacancy defects or interstitial defects, respectively, are already present, causing a given agglomerated defect to grow in size. Growth occurs because these agglomerated defect sites essentially act as "sinks," attracting and collecting intrinsic point defects because of the more favorable energy state of the agglomeration.

Accordingly, the formation and size of agglomerated defects are dependent upon the growth conditions, including $v/G_0$ (which impacts the initial concentration of such point defects), as well as the cooling rate or residence time of the main body of the ingot over the range of temperatures bound by the "nucleation threshold" at the upper end and the "diffusivity threshold" (which impacts the size and density of such defects) at the lower end. Thus, control of the cooling rate or residence time enables the formation of agglomerated intrinsic point defects to be suppressed over much larger ranges of values for $v/G_0$; that is, controlled cooling allows for a much larger "window" of acceptable $v/G_0$ values to be employed while still enabling the growth of substantially defect-free silicon.

As an example, one crystal puller used for controlling the cooling of monocrystalline ingots above the nucleation threshold of intrinsic point defects is disclosed in co-assigned U.S. patent application Ser. Nos. 09/344,003 and 09/338,826, which are incorporated in their entirety herein by reference. The crystal puller includes an electrical resistance heater mounted in the pull chamber of the crystal puller housing generally toward the bottom of the pull chamber of the housing. The electrical resistance heater has heating segments that may be constructed of equal length (e.g., a non-profiled heater) or of stepped, or staggered lengths (e.g., a profiled heater). As portions of the ingot grown in the puller are pulled upward into radial registration with the heater, heat is radiated by the heater to these portions of the ingot to reduce the cooling rate of the ingot.

Co-assigned U.S. patent application No. 09/661,745, the full disclosure of which is incorporated herein by reference, discloses a quenching process for growing a monocrystalline silicon ingot according to the Czochralski method in which the nucleation and/or growth of interstitial type defects is suppressed by controlling the cooling rate of the ingot through nucleation. More particularly, initial growth conditions are selected to provide an ingot containing silicon self-interstitials as the predominant intrinsic point defect from the center to the edge of the ingot, or a central core in which vacancies are the predominant intrinsic point defect surrounded by an axially symmetric region in which silicon self-interstitials are the predominant intrinsic point defect. As the ingot cools while being pulled upward within the crystal puller, the temperature of the ingot is maintained above the temperature range at which nucleation of the self-interstitials occurs, such as about 850° C.–950° C., for a time period sufficient for adequate diffusion of intrinsic point defects. Then, the ingot is rapidly cooled, or quenched, through the nucleation temperature range to inhibit nucleation. Below the nucleation temperature range, no further nucleation will occur. The process is disclosed as producing ingots that are substantially free of intrinsic point defects.

While the crystal puller configurations discussed above as having an electrical resistance heater disposed in the pull chamber of the crystal puller are effective for increasing the dwell time of the ingot above a desired temperature, these configurations are not as efficient as desired for carrying out the quenching process described above to produce ingots that are substantially free of intrinsic point defects. More particularly, the electrical resistance heaters previously disclosed are not long enough to grow defect-free ingots of substantial length, such as about one meter. However, lengthening the heater, such as to provide a single, elongate electrical resistance heater disposed in the pull chamber would require a substantial amount of electrical power to achieve the desired heating power output. Also, using such a heater, even if profiled in construction, substantially limits the flexibility of profiling the heating power output needed to control the temperature of the ingot as it is pulled upward within the crystal puller. Using such a heater would also limit the ability to grow ingots of various lengths in the crystal puller without changing the size of the heater.

SUMMARY OF THE INVENTION

Among the several objects and features of the present invention may be noted the provision of a crystal puller and method for growing an ingot according to the Czhochralski method which facilitates the growth of ingots that are substantially free of agglomerated intrinsic point defects; the provision of such a crystal puller that facilitates the growth of ingots of various lengths without changing the crystal puller configuration; the provision of a heater assembly which increases the duration at which the ingot resides at a temperature above the nucleation temperature of intrinsic point defects; the provision of such a heater assembly which allows for various heating power output profiles; and the provision of an adapter which facilitates the adaptation of existing crystal pullers to incorporate such a heater assembly.

Generally, a crystal puller of the present invention for growing monocrystalline silicon ingots according to the Czochralski method generally comprises a housing, a crucible in the housing for containing molten silicon and a pulling mechanism for pulling a growing ingot upward from the molten silicon. A first electrical resistance heater comprising a first heating element is sized and shaped for placement in the housing of the crystal puller generally above the crucible in spaced relationship with the outer surface of the growing ingot for radiating heat to the ingot as it is pulled upward in the housing relative to the molten silicon. The first heating element has an upper end and a lower end, with the lower end of the first heating element being disposed substantially closer to the molten silicon than the upper end when the first heating element is placed in the housing. A second electrical resistance heater comprising a second heating element is sized and shaped for placement in the housing of the crystal puller in generally longitudinally spaced relationship above the first electrical resistance heater and in spaced relationship with the outer surface of the growing ingot for radiating heat to the ingot as it is pulled upward in the housing relative to the first electrical resistance heater. The second heating element has an upper end and a lower end, with the lower end of the second heating element being in closely spaced relationship with the upper end of the first heating element of the first electrical resistance heater. The crystal puller is substantially free of structure interposed between the lower end of the second heating element and the upper end of the first heating element.

In another embodiment, the crystal puller comprises a housing, a crucible in the housing for containing molten silicon and a pulling mechanism for pulling a growing ingot upward from the molten silicon. A first electrical resistance heater comprising a first heating element is sized and shaped for placement in the housing of the crystal puller generally above the crucible in spaced relationship with the outer surface of the growing ingot for radiating heat to the ingot as it is pulled upward in the housing relative to the molten silicon. The first heating element having an upper end and a lower end, with the lower end of the first heating element being disposed substantially closer to the molten silicon than the upper end when the first heating element is placed in the housing. A second electrical resistance heater comprising a second heating element is sized and shaped for placement in the housing of the crystal puller in generally longitudinally spaced relationship above the first electrical resistance heater and in spaced relationship with the outer surface of the growing ingot for radiating heat to the ingot as it is pulled upward in the housing relative to the first electrical resistance heater. The second heating element has an upper end and a lower end, with the lower end of the second heating element being in spaced relationship with the upper end of the first heating element. At least one of the first and second electrical resistance heaters is constructed such that the heating power output generated by the heating element of the at least one of the first and second electrical resistance heaters gradually increases from the lower end to the upper end of the heating element.

A combination adapter and heater assembly of the present invention for use with a crystal puller of the type used for growing monocrystalline silicon ingots according to the Czochralski method generally comprises a generally tubular adapter having a side wall defining a central passage sized for allowing through passage of the ingot as the ingot is pulled upward within the housing. A flange extends generally radially outward from the side wall for releasably mounting the adapter on the housing above the crucible whereby the side wall of the adapter at least partially defines the housing. A heater assembly is disposed in the adapter and mounted on the adapter side wall such that the adapter and heater assembly are installable in and removable from the crystal puller as a single unit. The heater assembly includes a first electrical resistance heater comprising a first heating element mounted on the adapter side wall for placement in the housing of the crystal puller generally above the crucible when the adapter and heater assembly are installed in the crystal puller. The first heating element has an upper end and a lower end, with the lower end of the first heating element being disposed substantially closer to the molten silicon than the upper end when the adapter and heater assembly are installed in the crystal puller. The heater assembly also includes a second electrical resistance heater comprising a second heating element mounted on the adapter side wall above the first electrical resistance heater. The second heating element has an upper end and a lower end, with the lower end of the second heating element being in closely spaced relationship with the upper end of the first heating element.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
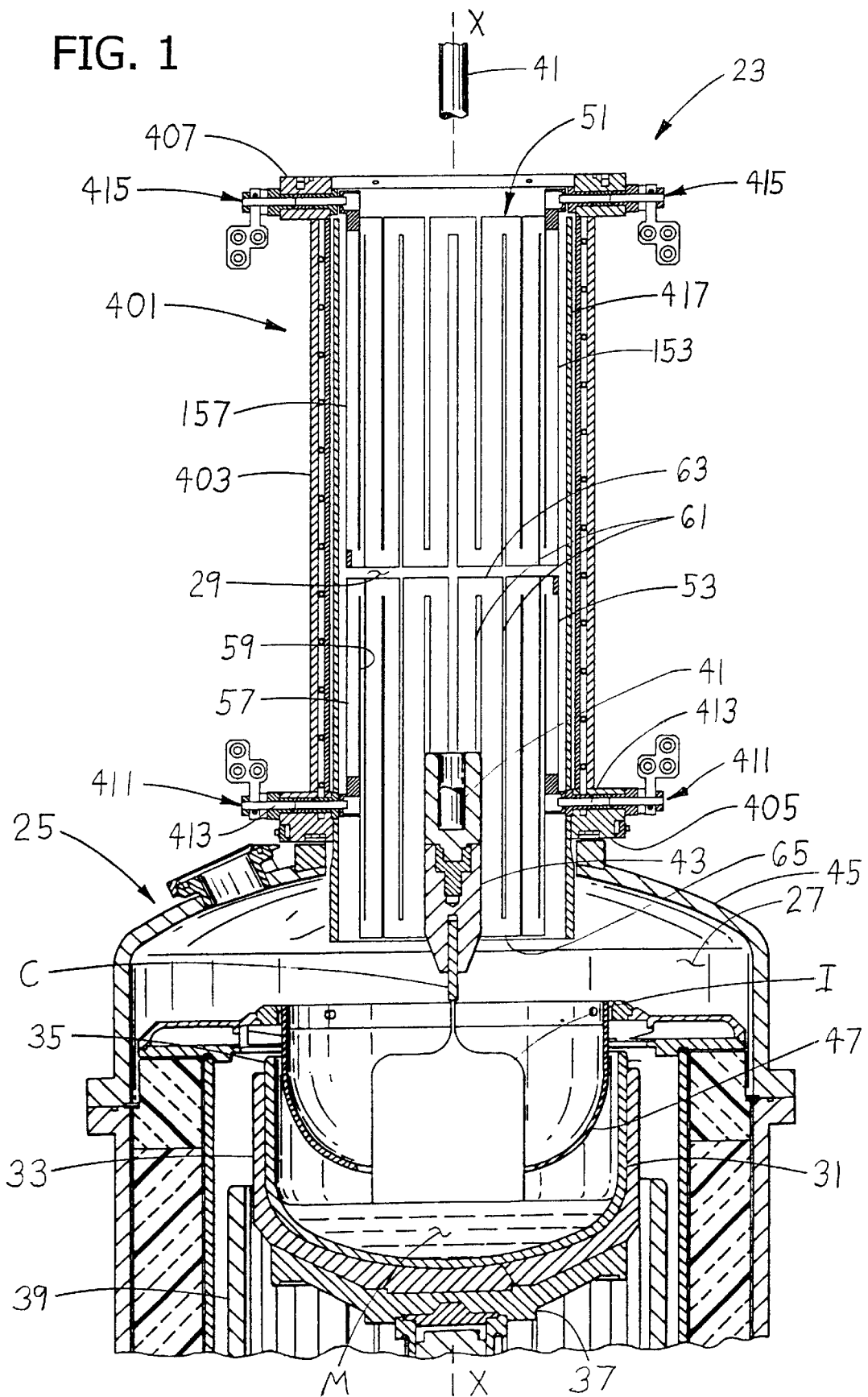
FIG. 1 is a schematic, fragmentary vertical section of a crystal puller of the present invention showing a heater assembly as it is positioned during growth of a monocrystalline silicon ingot.

Referring now to the drawings and in particular to FIG. 1, a crystal puller of the present invention of the type used to grow monocrystalline silicon ingots (e.g., ingot I of FIG. 1) according to the Czochralski method is generally designated in its entirety by the reference numeral 23. The crystal puller 23 includes a water cooled housing, generally indicated at 25, for isolating an interior which includes a lower crystal growth chamber 27 and an upper pull chamber 29 having a smaller transverse dimension than the growth chamber. The growth chamber portion of the housing 25 has a generally dome shaped upper wall 45 transitioning from the lower growth chamber 27 to the narrowed upper pull chamber 29. A quartz crucible 31 seated in a susceptor 33 has a cylindrical side wall 35 and contains molten semiconductor source material M from which the monocrystalline silicon ingot I is grown. The susceptor 33 is mounted on a turntable 37 for rotation of the susceptor and crucible 31 about a central longitudinal axis X of the crystal puller 23. The crucible 31 is also capable of being raised within the growth chamber 27 to maintain the surface of the molten source material M at a generally constant level as the ingot I is grown and source material is removed from the melt. An electrical resistance heater 39 surrounds the crucible 31 for heating the crucible to melt the source material M in the crucible. The heater 39 is controlled by an external control system (not shown) so that the temperature of the molten source material M is precisely controlled throughout the pulling process.

A pulling mechanism includes a pull shaft 41 extending down from a mechanism (not shown) capable of raising, lowering and rotating the pull shaft. The crystal puller 23 may have a pull wire (not shown) rather than a shaft 41, depending upon the type of puller. The pull shaft 41 terminates in a seed crystal chuck 43 which holds a seed crystal C used to grow the monocrystalline ingot I. The pull shaft 41 has been mostly broken away in FIG. 1, both at its top and where it connects to the chuck 43. In growing the ingot I, the pulling mechanism lowers the seed crystal C until it contacts the surface of the molten source material M. Once the seed crystal C begins to melt, the pulling mechanism slowly raises the seed crystal up through the growth chamber 27 and pull chamber 29 to grow the monocrystalline ingot I. The speed at which the pulling mechanism rotates the seed crystal C and the speed at which the pulling mechanism raises the seed crystal (i.e., the pull rate v) are controlled by the external control system. A heat shield 47 is supported in the lower growth chamber 27 of the housing 25 for surrounding the ingot between the ingot and the crucible heater 39 to substantially shield the ingot from heat radiated by the crucible heater as the ingot is pulled upward within the growth chamber. The general construction and operation of the crystal puller 23, except to the extent explained more fully below, is conventional and known by those of ordinary skill in the art.

A heater assembly of the present invention is generally indicated at 51 and includes a pair of electrical resistance heaters 53, 153 disposed axially within the pull chamber 29 of the housing 25 in longitudinal end-to-end relationship with each other on the longitudinal axis X of the crystal puller 23. The first, or lower heater 53 of the heater assembly 51 comprises a generally tubular heating element 57 mounted on the portion of the housing 25 defining the pull chamber 29 adjacent the dome-shaped upper transition wall 45 of the housing. The heating element 57 extends downward into the growth chamber 27, terminating substantially above the crucible 31 containing the molten source material M. For example, the heating element 57 illustrated in FIG. 1 has a length of about 500 mm and extends down into the growth chamber 27 to a distance approximately 500–550 mm above the melt surface. A central opening 59 of the heating element 57 allows the growing ingot I to pass centrally through the heating element as it is pulled upward within the housing 25 of the puller 23. As shown in FIG. 2, the heating element 57 comprises vertically oriented heating segments 61 arranged in side-by-side relationship and connected to each other to form an electrical circuit. More particularly, upper and lower ends, designated 63 and 65, respectively, of adjacent heating segments 61 are alternatingly connected to each other in a continuous serpentine configuration forming a closed geometric shape; in the illustrated embodiment, a cylinder. The cross-sectional areas of the heating segments 61 are substantially equal along the height of the segments, including at the connecting portions of adjacent segments, so that the electrical resistance of the heating segments is generally constant throughout the heating element 57. As a result, the heat generated by the heater 53 is generally uniform throughout the heating segments 61.

The heating element 57 of the illustrated embodiment is constructed of a non-contaminating resistive heating material which provides resistance to the flow of electrical current therethrough whereby the resistance to current flow generates heat radiated from the heating element. A particularly preferred resistive heating material is silicon carbide coated graphite. However, the heating element 57 may also be constructed of highly purified extruded graphite, iso-molded graphite, carbon fiber composite, tungsten, metal or other suitable materials without departing from the scope of this invention.

The second, or upper heater 153 of the heater assembly 51 also comprises a generally tubular heating element 157 and is mounted on the portion of the housing 25 defining the upper pull chamber 29, above the lower heater 53 of the heater assembly. The heating element 157 is disposed fully within the pull chamber 29, with the bottom of the heating element being positioned above the top of the heating element 57 of the lower heater 53 in closely spaced relationship therewith to minimize discontinuities in the heating power output profile of the heater assembly as an ingot I is pulled upward within the pull chamber past the lower heater and into radial registry with the upper heater. As an example, the spacing between the top of the lower heater 53 and the bottom of the upper heater 153 of the heater assembly 51 of FIG. 1 is about 25 mm. Construction of the upper heater 153 is substantially the same as that of the lower heater 53 and therefore will not be further described herein except to the extent necessary to disclose the present invention.

Figure 2A:
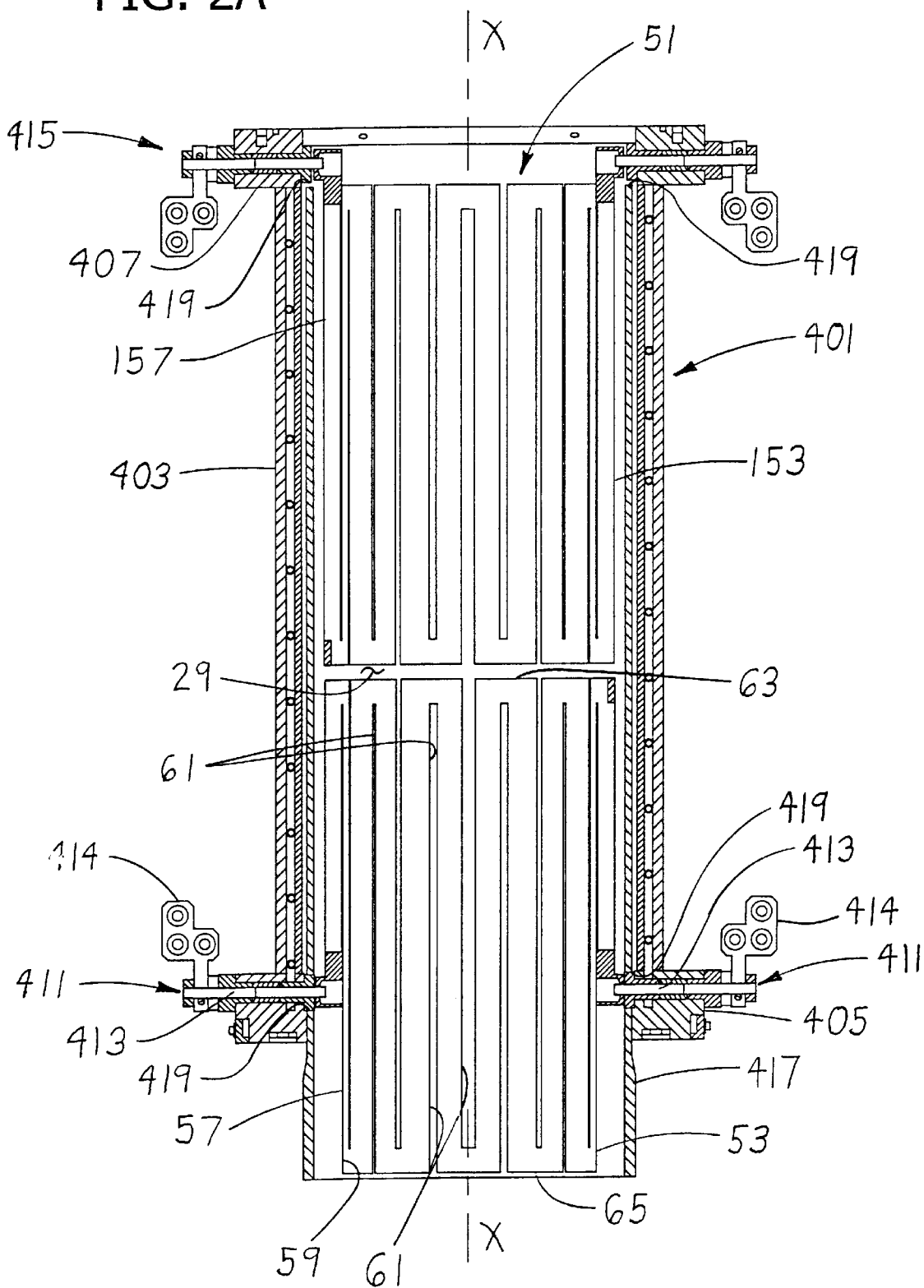
FIG. 2A is an enlarged view of a portion of the crystal puller of FIG. 1 showing an adapter and the heater assembly including a pair of non-profiled heaters mounted to the adapter.
Figure 2B:
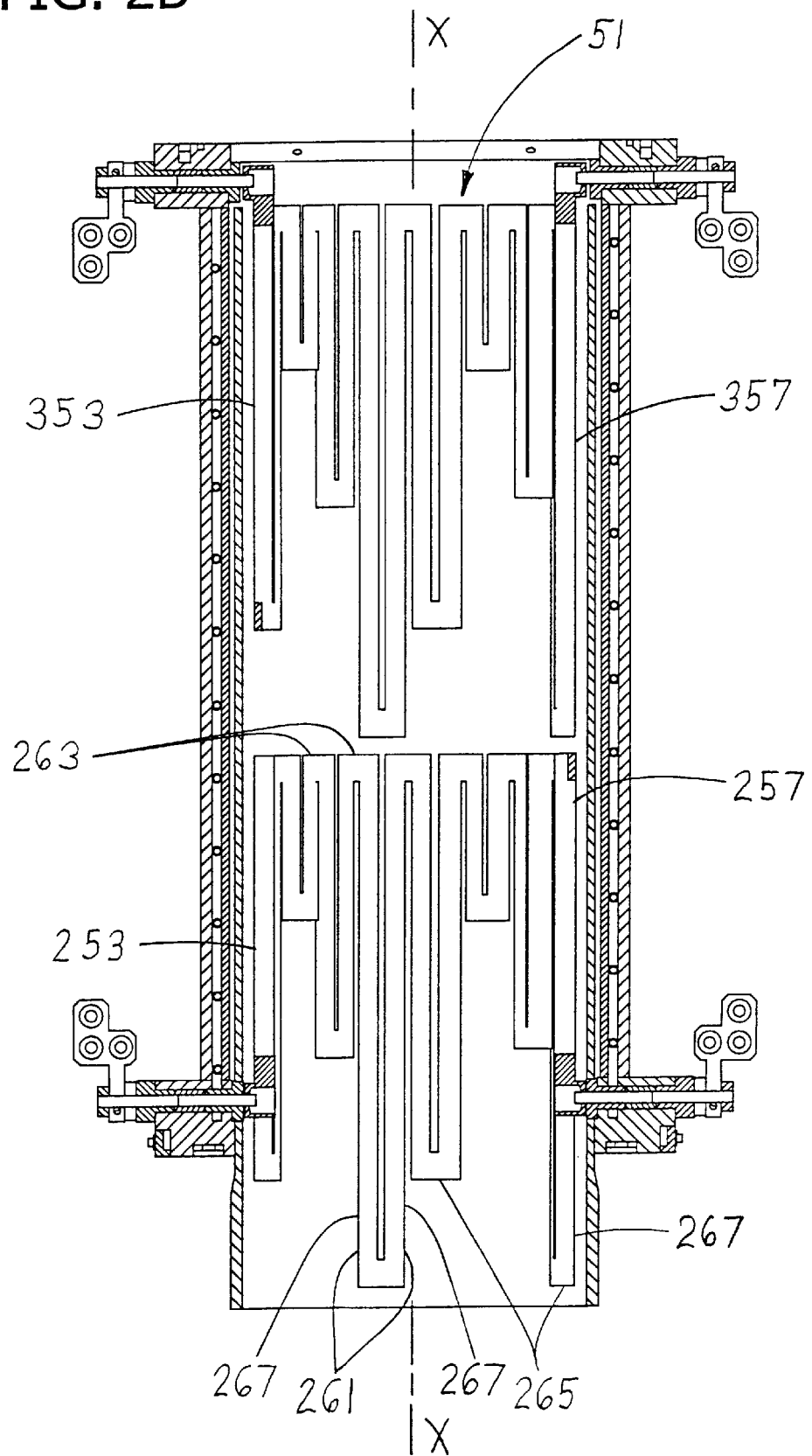
FIG. 2B is a view similar to FIG. 2A but showing the heater assembly as including a pair of profiled heaters mounted to the adapter.

FIG. 2B illustrates the heater assembly 51 of the present invention as comprising lower and upper heaters 253, 353 having heating elements 257, 357 that are each profiled in construction such that the heating power output generated by each heating element gradually increases from the lower end to the upper end of the heating element. A preferred profiled heater 253, 353 is disclosed in co-assigned U.S. patent application No. 09/338,826. With reference to the lower heater 253 of the heater assembly 51 shown in FIG. 2B, the heating segments 261 of the heating element 257 of the profiled heater are of varying lengths, with upper ends 263 of the segments being co-planar about the circumference of the heating element at the top of the heating element and lower ends 265 of the segments being staggered vertically with respect to each other because of the varying lengths of the segments. The lower ends 265 of the longest segments 267 define the bottom of the heating element 257.

As an example, the heating segments 261 of the heating element 257 shown in FIG. 2B are of four different lengths, with the longest segments 267 being about 500 mm in length to define the overall length of the heating element. Thus, the longest heating segments 267 are constructed for radially opposed relation with the ingot I over only about ¼ of the circumference of the crystal ingot near the bottom of the heating element 257, while the heating element fully surrounds the ingot at the top of the heating element. The cross-sectional areas of the heating segments 261 are substantially equal along the height of the segments, including at the connecting portions of adjacent segments, so that the electrical resistance of the heating segments is generally constant throughout the heating element 257. As a result, the heat radiated by the heater 253 is generally uniform throughout the heating segments 261.

Figure 3A:
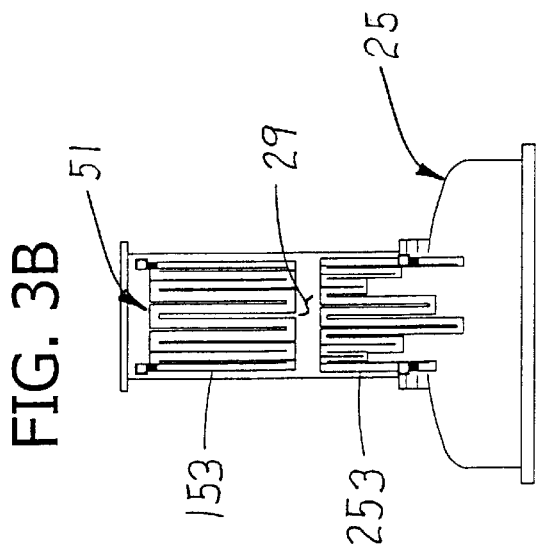
FIGS. 3A, 3B, 3C and 3D are schematic vertical sections of a portion of a crystal puller similar to that shown in FIG. 1 illustrating various configurations of the heater assembly.
Figure 3B:
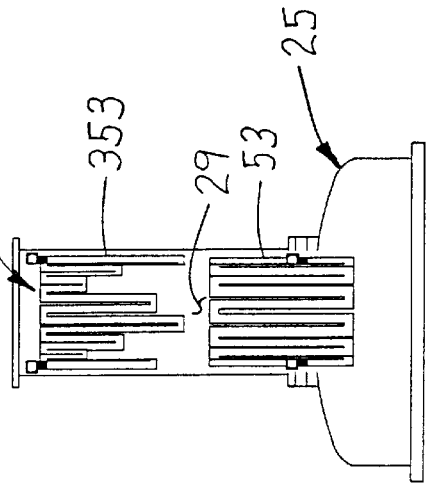
Figure 3C:
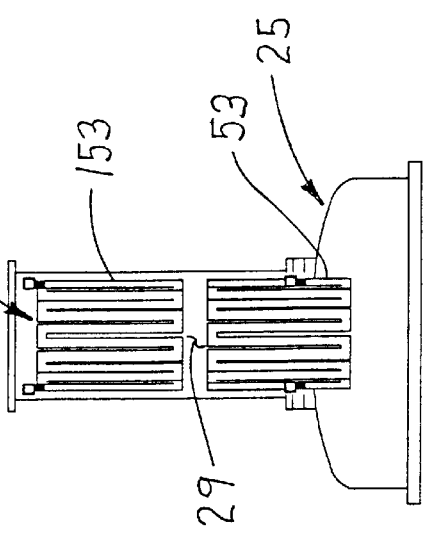
Figure 3D:
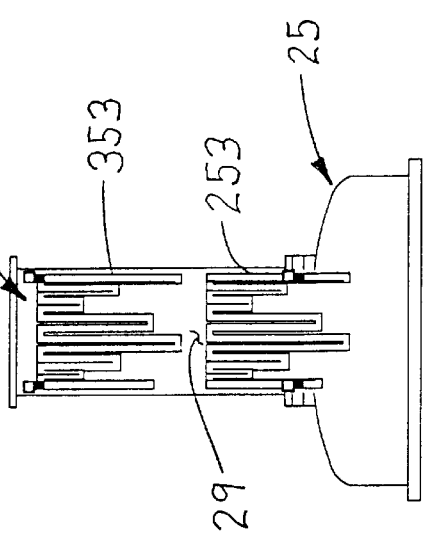

Thus, it may be seen that the heating element 257 for a single electrical circuit that radiates more heat to the crystal at its top than at its bottom. Construction of the upper heater 353 is substantially the same as that of the lower heater 253 of the heater assembly 51 of FIG. 2B and therefore will not be further described herein. However, it is understood that the upper heater 353 may be profiled in a manner different from the profiled construction of the lower heater 253 without departing from the scope of this invention. It is also understood that the profiled lower and/or upper heater 253, 353 may be configured in such a manner that the heating power output gradually decreases from the bottom to the top of the heater or is otherwise profiled to provide a desired heating power output profile along the height of the heater. Moreover, the heater assembly 51 of the present invention may comprise any combination of a non-profiled heaters 53, 153 and profiled heaters 253, 353. FIGS. 3A, 3B, 3C and 3D illustrate various configurations of the heater assembly 51 that may be used in the crystal puller 23 of the present invention, such as non-profiled lower and upper heaters 53, 153 (FIG. 3A), a profiled lower heater 253 and a non-profiled upper heater 153 (FIG. 3B), profiled lower and upper heaters 253, 353 (FIG. 3C) and a non-profiled lower heater 53 and a profiled upper heater 353 (FIG. 3D).

Referring back to FIG. 2A, the heater assembly 51 is shown and described herein as being mounted to an adapter, generally indicated at 401, configured for equipping existing crystal pullers 23 with the heater assembly whereby the adapter defines, at least in part, the portion of the housing 25 defining the upper pull chamber 29. The adapter 401 comprises a generally cylindrical water-cooled side wall 403, a lower mounting flange 405 extending radially outward from the lower end of the side wall for mounting the adapter on the dome-shaped transition wall 45 of the housing 25 and an upper mounting flange 407 for mounting the portion of the housing defining the pull chamber 29 of an existing crystal puller 23 on the upper end of the adapter. The lower heater 53 of the heater assembly 51 is mounted on the side wall 403 of the adapter 401 generally at the lower mounting flange 405 and is electrically connected to a source of electrical power (not shown) via a pair of electrode assemblies, generally indicated at 411. Each electrode assembly 411 includes an electrode 413 extending radially within the lower flange 405 of the adapter 401 to electrically connect the power source to the lower heater 53 via a suitable connector 414. The upper heater 153 of the heater assembly 51 is mounted on the adapter side wall 403 generally at the upper mounting flange 407 and is electrically connected to a separate source of electrical power (not shown) via another pair of electrode assemblies, generally indicated at 415. The electrode assemblies 411, 415 of the illustrated embodiment for electrically connecting the lower and upper heaters 53, 153 to their respective power sources are substantially identical in construction. A particularly preferred electrode assembly is disclosed in co-assigned U.S. patent application No. 09/170,789, the entire disclosure of which is incorporated herein by reference.

A tubular heat shield 417 constructed of graphite, graphite insulation or other suitable insulating material, or a combination of any of these materials, is disposed in the adapter 401 generally between the adapter side wall 403 and the lower and upper heaters 53, 153 to inhibit cooling of the heating element by the water cooled side wall of the adapter. The shield 417 has openings 419 to permit through passage of the electrode assemblies 411, 415 to electrically connect the respective power sources to the heaters 53, 153.

It is understood that adapter configurations other than a single adapter 401 mounting both the lower and upper heater 53, 153 may be used without departing from the scope of this invention. For example, the heaters 53, 153 may be separately and individually mounted on respective shorter adapters (not shown) wherein the shorter adapters are configured for releasable, stacked (e.g., lower mounting flange to upper mounting flange) connection with each other to configure the heater assembly 51 according to the various combinations shown in FIGS. 3A–3D. It is also contemplated that new crystal pullers may be configured to have a pull chamber 29 sufficiently long to accommodate more than one electrical resistance heater 53, 153, 253, 353, so that an adapter 401 is no longer required, without departing from the scope of this invention. It is further contemplated that more than two heaters may be disposed in the pull chamber 29 without departing from the scope of this invention.

Electrical power supplied to the lower heater 53 is controlled by a power control device (not shown) and electrical power supplied to the upper heater 153 is controlled by a separate power control device (not shown). Thus, it will be recognized that the amount of electrical power delivered to the lower heater 53 may be different (e.g., less than or greater than) than the amount of electrical power delivered to the upper heater 153 of the heater assembly 51, depending on the desired cooling rate of the ingot I. As an example the electrical power supplied to each heater 53, 153 is preferably in the range of about 0–50 kW, and is more preferably in the range of about 15–25 kW.

Figure 4:
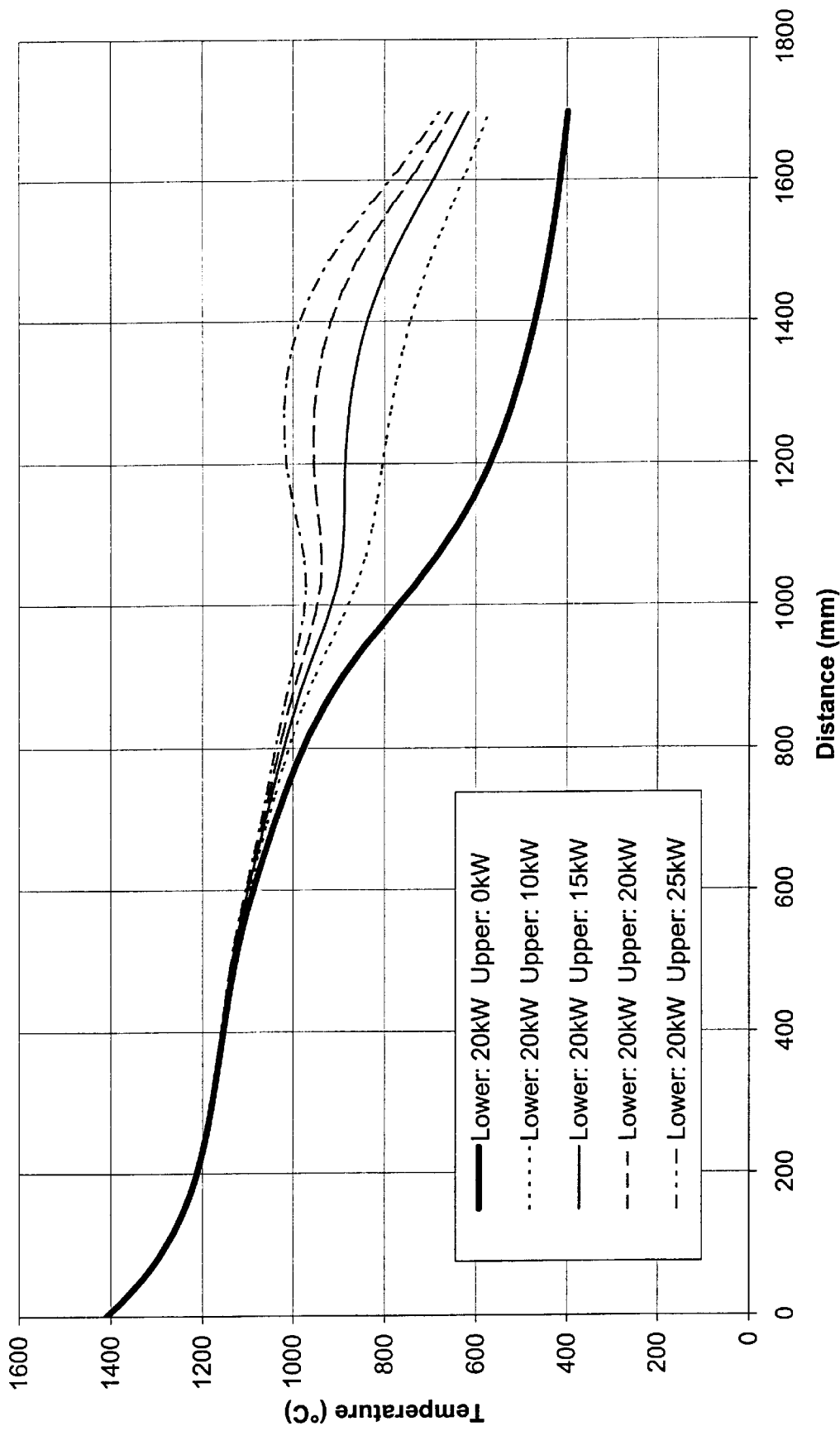
FIG. 4 is a plot of ingot temperature versus the distance of the ingot above the melt surface for a finite element analysis modeling the crystal puller of FIG. 1 for various profiles of electrical power supplied to the heater assembly.

A finite element model analysis was conducted to simulate the growth of monocrystalline silicon ingots I according to the Czochralski method in a crystal puller 23 of the type described above and shown in FIG. 1 incorporating a heater assembly 51 comprising non-profiled lower and upper heaters 53, 153 (FIG. 2A). Each of the heaters 53, 153 was modeled to having a length of about 500 mm and the bottom of the lower heater was modeled as being spaced about 500–550 mm above the melt surface of the molten source material M. The growth of five ingots, each having a main portion diameter of about 210 mm and a length of about 1200 mm, was simulated with the electrical power supplied to the lower heater 53 of the heater assembly 51 being about 20 kW and the electrical power supplied to the upper heater being, respectively for the five simulations, 0 kW (e.g., to simulate growth of the ingot in a crystal puller where a single heater is disposed in the upper pull chamber, such as in co-assigned U.S. patent application No. 09/344,003); 10 kW; 15 kW; 20 kW; and 25 kW. The pull rate for each growth simulation was about 0.33 mm/min. FIG. 4 is a plot of the ingot temperature (e.g., on the central axis of the ingot), otherwise referred to as isotherms, versus the distance (e.g. height) of the crystal above the melt surface for each of the simulations.

The results of the finite element analysis indicate that the height of the isotherms in the range of about 850° C.–950° C., which is the approximate nucleation temperature range of silicon self-interstitials, substantially increases with the level of power supplied to the upper heater 153. For the simulations in which the power supplied to the upper heater 153 was 20 kW and 25 kW, the temperature of the ingot actually increased, such as above about 1000 mm from the melt surface, after it had been cooled. This indicates that the ingot was reheated by the heaters 53, 153 after it had already cooled below a certain temperature. While the temperature of the ingot was desirably maintained above 850° C.–950° C. for a substantial duration in these simulations, reheating of the ingot is generally known to be undesirable. Supplying the upper heater 153 with about 15 kW of electrical power resulted in the temperature of the ingot being maintained above 850° C.–950° C. for a substantially longer duration in comparison to the unpowered (e.g., 0 kW) upper heater simulation, and did not result in reheating of the ingot. For example, the height of the 850° C. isotherm as illustrated in FIG. 4 increased approximately 400 mm by supplying 15 kW of electrical power to the upper heater 153 compared to the unpowered upper heater. At a pull rate of about 0.33 mm/min, this represents an increased dwell time of the ingot above 850° C. of approximately 20 hours.

In operation according to a preferred embodiment of a method of the present invention for growing monocrystalline silicon ingots, the results of the finite element analysis discussed above are generally applied to grow an ingot that is substantially free of intrinsic point defects. The method is similar to that disclosed in co-assigned U.S. patent application Ser. No. 09/661,745, the full disclosure of which is incorporated herein by reference, which discloses a process for suppressing the nucleation and/or growth of interstitial type defects during growth of the ingot according to the Czochralski method by controlling the cooling rate of the ingot through nucleation. The process generally includes selecting initial growth conditions to provide an ingot containing silicon self-interstitials as the predominant intrinsic point defect from the center to the edge of the ingot, or a central core in which vacancies are the predominant intrinsic point defect surrounded by an axially symmetric region in which silicon self-interstitials are the predominant intrinsic point defect. As the ingot cools while being pulled upward within the crystal puller 23, the temperature of the ingot is maintained above the temperature range at which nucleation of the self-interstitials occurs, such as about 850° C.–950° C., for a time period sufficient for adequate diffusion of intrinsic point defects. Then, the ingot is rapidly cooled, or quenched, through the nucleation temperature range to inhibit nucleation. Below the nucleation temperature range, no further nucleation will occur.

Figure 5A:
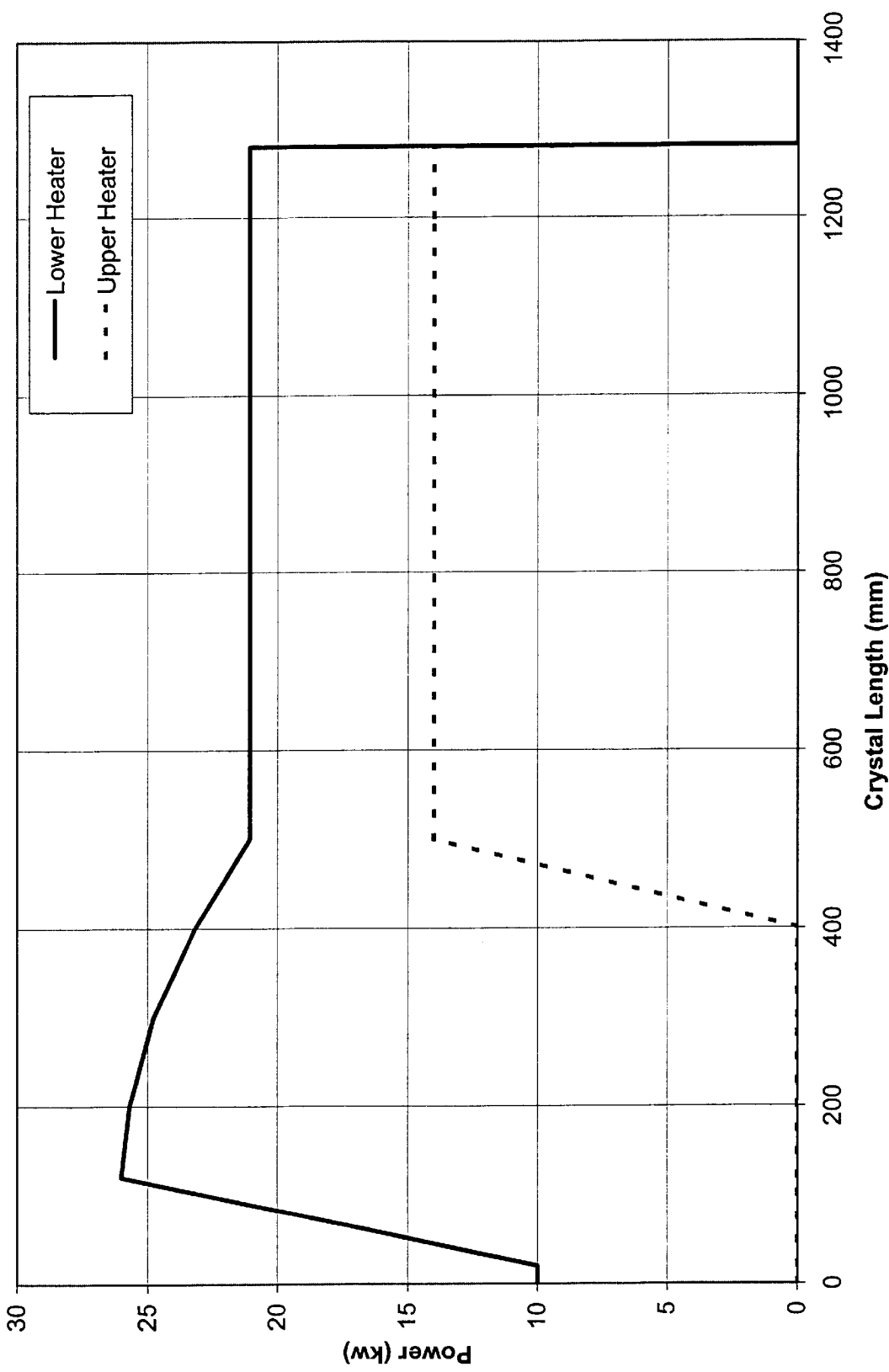
FIGS. 5A, 5B and 5C are various profiles of electrical power supplied to the heater assembly of FIG. 1 for growing an ingot in accordance with a method of the present invention.

FIG. 5A illustrates a power profile for supplying electrical power to the lower and upper heaters 53, 153 of the heater assembly 51 in accordance with the method of the present invention. The upper and lower heaters 53, 153 of the heater assembly 51 are unpowered upon initiation of ingot growth. After polycrystalline silicon ("polysilicon") is deposited in the crucible 31 and melted by heat radiated from the crucible heater 39, the seed crystal C is brought into contact with the molten silicon M and a single crystal ingot I is grown by slow extraction via the pulling mechanism, such as at a rate of about 0.33 mm/min. The growing ingot begins cooling immediately as it is pulled upward from the melt and continues cooling as it is pulled further upward through the lower crystal growth chamber 27 and upper pull chamber 29. Shortly after the ingot begins to grow, such as when the ingot has grown to a length of about 20 mm, electrical power is supplied to the lower heater 53 starting at about 10 kW. The electrical power supplied to the lower heater 53 is then slowly increased to about 26 kW as the ingot grows to about 120 mm (e.g., over a time period of about 5 hours at a pull rate of about 0.33 mm/min). Heat from the lower heater 53 radiates downward within the growth chamber 27 toward the ingot and the melt surface to reduce the cooling rate of the ingot and to reduce the radial temperature gradient of the ingot at the solid/liquid interface of the melt. As the ingot is pulled further upward from the melt, the electrical power supplied to the lower heater 53 of the heater assembly 51 is slowly decreased to about 21 kW. It is contemplated that the electrical power supplied to the lower heater may alternatively remain constant at about 21 kW without departing from the scope of this invention.

Once the ingot I has been pulled upward from the melt surface to a height of about 400 mm, electrical power is supplied to the upper heater 153 of the heater assembly 51 and is slowly increased (e.g., over a duration of about five hours at a pull rate of about 0.33 mm/min) to about 14 kW. The ingot I approaches and comes into radial registry with the heater assembly 51, and more particularly the bottom of the lower heater 53, whereby heat from the lower and upper heaters 53, 153 is radiated toward the ingot to further reduce the cooling rate of the ingot. As a result, the dwell time of the ingot above the temperature range of about 850–950° C. is substantially increased. Heat from the upper heater 153 also radiates down toward the melt surface along with heat radiated from the lower heater 53 to further control the radial temperature gradient of the ingot at the liquid/solid interface.

The power profile illustrated in FIG. 5A is for growing an ingot in which the main portion of the ingot (e.g., the generally cylindrical central portion of the ingot) has a length of about 1000 mm. Once the ingot reaches this length, the pull rate is increased to form a generally conical tail at the lower end the ingot before the ingot is separated from the melt. The lower and upper heaters 53, 153 of the heater assembly 51 are powered until the tail of the ingot separates from the melt. For example, the tail of the ingot grown in accordance with the power profile of FIG. 5A has a length of approximately 280 mm. One the tail is separated from the melt, the lower and upper heaters 53, 153 are no longer supplied with electrical power. The pull rate of the ingot is then further increased to pull the ingot upward faster within the pull chamber 29, thereby substantially increasing the rate of cooling of the ingot to inhibit nucleation of intrinsic point defects.

Figure 5B:
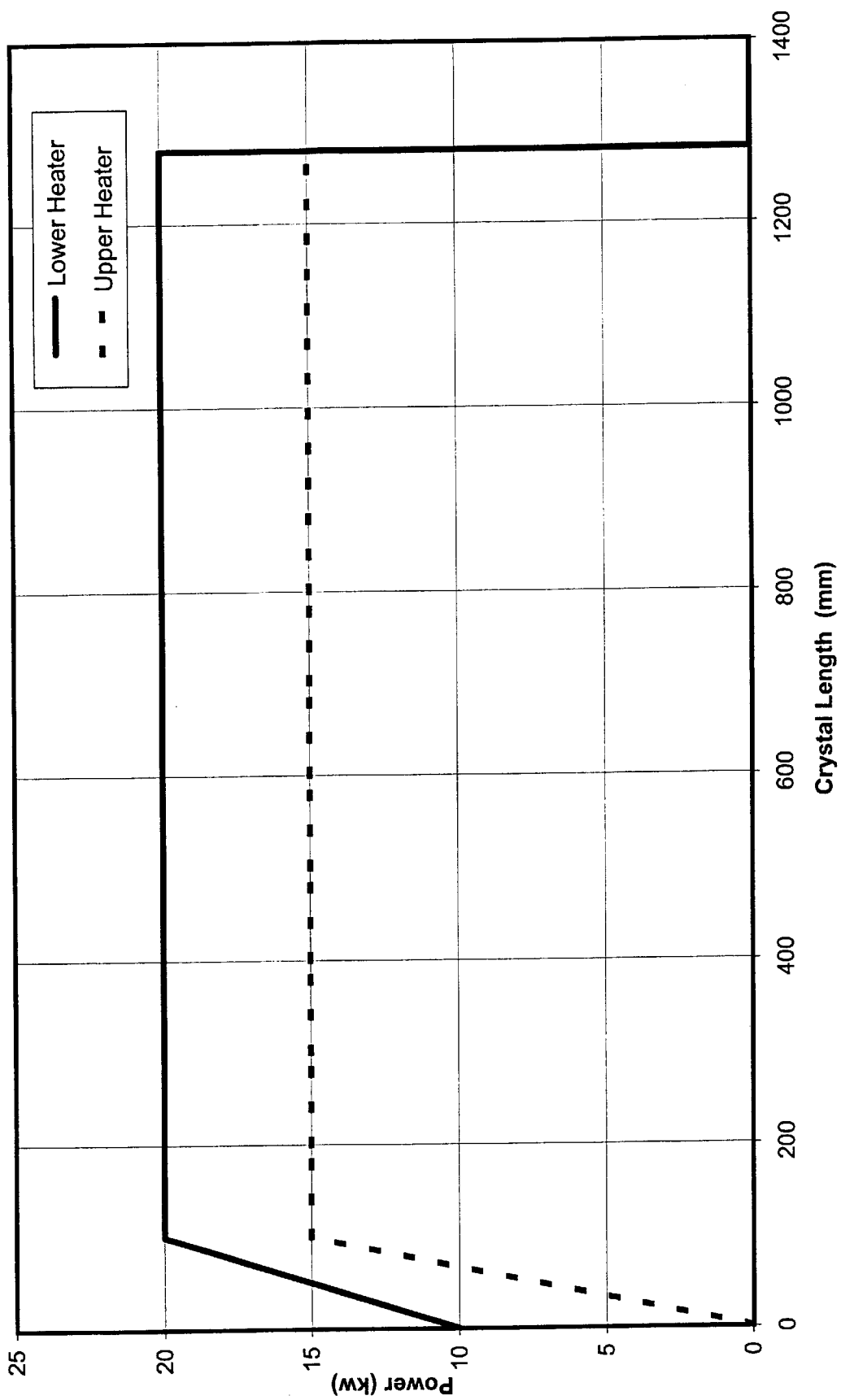
Figure 5C:
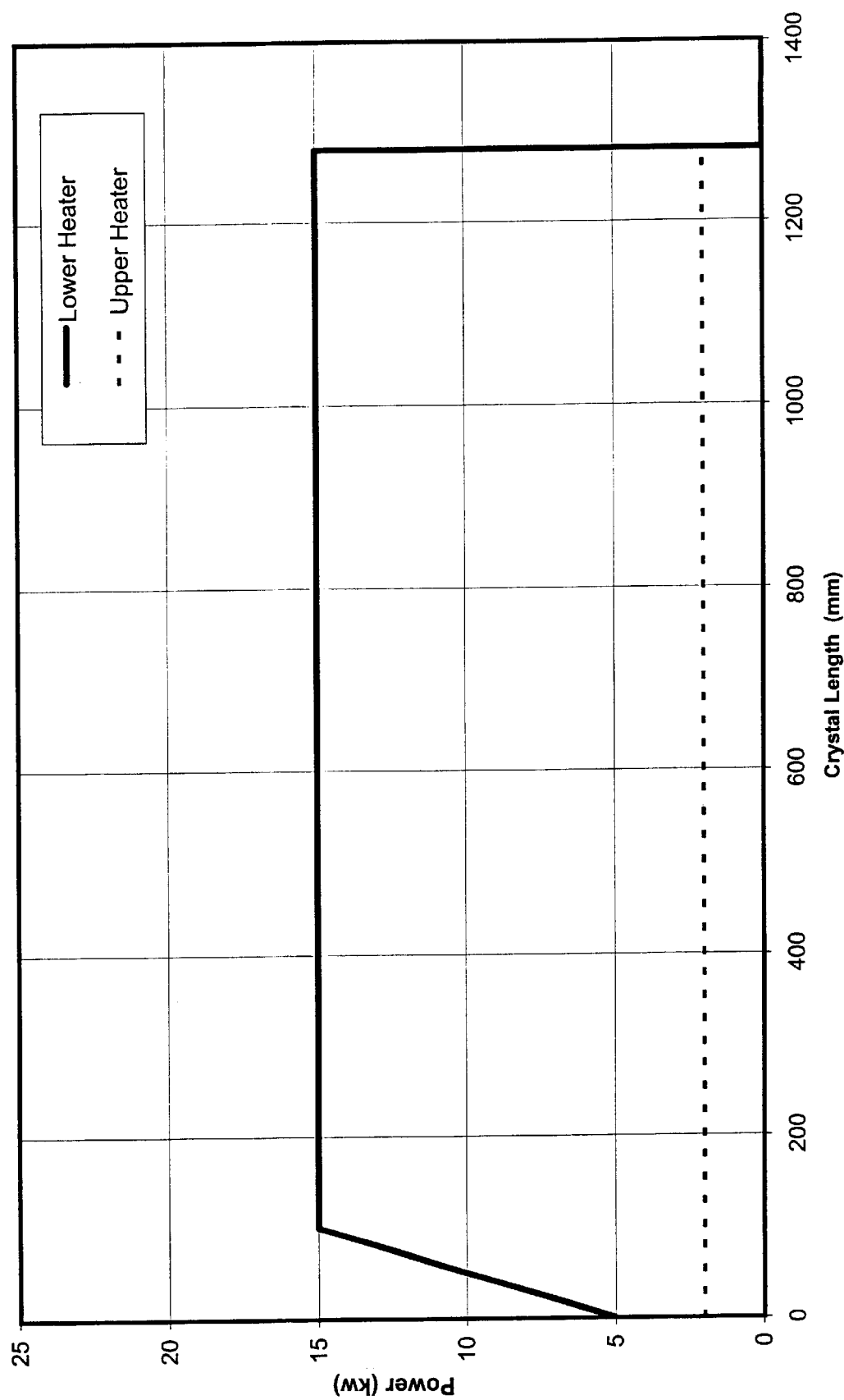

It is contemplated that other electrical power profiles for the lower and upper heaters 53, 153 of the heater assembly 51 may be used for growing ingots in the crystal puller 23 according to the method of the present invention. For example, with reference to FIG. 5B, where a longer crystal is to be grown, power is supplied to both heaters 53,153 of the heater assembly 51 for substantially the entire duration of ingot growth, with the power supplied to the lower heater being about 20 kW and the power supplied to the upper heater being about 15 kW. Where a shorter crystal is to be grown, electrical power supplied to the lower and upper heaters 53, 153 of the heater assembly 51 may be substantially reduced, such as is shown in FIG. 5C, to reduce the risk of reheating of the ingot. The lower heater 53 is supplied with about 15 kW of electrical power throughout growth of the ingot while the upper heater is supplied with only 2 kW of electrical power, although it is contemplated that no electrical power may be supplied to the upper heater.

It will be observed from the foregoing that the crystal puller and method described herein satisfies the various objectives of the present invention and attains other advantageous results. Providing a heater assembly 51 having a pair of heaters 53, 153 arranged longitudinally within the crystal puller 23 and electrically connected to different power sources provides the flexibility needed to obtain a desired power heating power output profile for growing an ingot that is substantially free of intrinsic defects. More particularly, the heaters may be constructed to have either a non-profiled or a profiled configuration and may be powered at different levels of electrical power, and at different stages during growth of the ingot.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A crystal puller for growing monocrystalline silicon ingots according to the Czochralski method, the crystal puller comprising:

a housing;

a crucible in the housing for containing molten silicon;

a pulling mechanism for pulling a growing ingot upward from the molten silicon;

a first electrical resistance heater comprising a first heating element sized and shaped for placement in the housing of the crystal puller generally above the crucible in spaced relationship with the outer surface of the growing ingot for radiating heat to the ingot as it is pulled upward in the housing relative to the molten silicon, the first heating element having an upper end and a lower end, the lower end of the first heating element being disposed substantially closer to the molten silicon than the upper end when the first heating element is placed in the housing; and a second electrical resistance heater comprising a second heating element sized and shaped for placement in the housing of the crystal puller in generally longitudinally spaced relationship above the first electrical resistance heater and in spaced relationship with the outer surface of the growing ingot for radiating heat to the ingot as it is pulled upward in the housing relative to the first electrical resistance heater, the second heating element having an upper end and a lower end, the lower end of the second heating element being in closely spaced relationship with the upper end of the first heating element of the first electrical resistance heater, the crystal puller being substantially free of structure interposed between the lower end of the second heating element and the upper end of the first heating element.

2. A crystal puller as set forth in claim 1 wherein the power supplied to the first electrical resistance heater is greater than the power supplied to the second electrical resistance heater.

3. A crystal puller as set forth in claim 1 wherein said first and second electrical resistance heaters have separate sources of electrical power.

4. A crystal puller as set forth in claim 1 wherein the heating power output of the second electrical resistance heater is substantially less than the heating power output of the first electrical resistance heater.

5. A crystal puller for growing monocrystalline silicon ingots according to the Czochralski method, the crystal puller comprising:

a housing;

a crucible in the housing for containing molten silicon;

a pulling mechanism for pulling a growing ingot upward from the molten silicon;

a first electrical resistance heater comprising a first heating element sized and shaped for placement in the housing of the crystal puller generally above the crucible in spaced relationship with the outer surface of the growing ingot for radiating heat to the ingot as it is pulled upward in the housing relative to the molten silicon, the first heating element having an upper end and a lower end, the lower end of the first heating element being disposed substantially closer to the molten silicon than the upper end when the first heating element is placed in the housing; and a second electrical resistance heater comprising a second heating element sized and shaped for placement in the housing of the crystal puller in generally longitudinally spaced relationship above the first electrical resistance heater and in spaced relationship with the outer surface of the growing ingot for radiating heat to the ingot as it is pulled upward in the housing relative to the first electrical resistance heater, the second heating element having an upper end and a lower end, the lower end of the second heating element being in spaced relationship with the upper end of the first heating element, at least one of the first and second electrical resistance heaters being constructed such that the heating power output generated by the heating element of said at least one of the first and second electrical resistance heaters gradually increases from the lower end to the upper end of the heating element.

6. A crystal puller as set forth in claim 5 wherein each of the first and second electrical resistance heaters is constructed such that the heating power output generated by the first and second heating elements gradually increases from the lower end to the upper end of each of said first and second heating elements.

7. A combination adapter and heater assembly for use with a crystal puller of the type used for growing monocrystalline silicon ingots according to the Czochralski method, the crystal puller having a housing, a crucible in the housing for containing molten silicon, and a pulling mechanism for pulling a growing ingot upward from the molten silicon within the housing, the combination comprising:

an generally tubular adapter having a side wall defining a central passage sized for allowing through passage of the ingot as the ingot is pulled upward within the housing and a flange extending generally radially outward from the side wall for releasably mounting the adapter on the housing above the crucible whereby the side wall of the adapter at least partially defines the housing, and a heater assembly disposed in the adapter and mounted on the adapter side wall such that the adapter and heater assembly are installable in and removable from the crystal puller as a single unit, the heater assembly including a first electrical resistance heater comprising a first heating element mounted on the adapter side wall for placement in the housing of the crystal puller generally above the crucible when the adapter and heater assembly are installed in the crystal puller, the first heating element having an upper end and a lower end, the lower end of the first heating element being disposed substantially closer to the molten silicon than the upper end when the adapter and heater assembly is installed in the crystal puller, and a second electrical resistance heater comprising a second heating element mounted on the adapter side wall above the first electrical resistance heater, the second heating element having an upper end and a lower end, the lower end of the second heating element being in closely spaced relationship with the upper end of the first heating element.

8. A combination adapter and heater assembly as set forth in claim 7 wherein the side wall of the adapter has openings therein to permit access to the first and second electrical resistance heaters of the heater assembly through the side wall of the adapter for electrically connecting the first and second electrical resistance heaters with at least one source of electrical power.

* * * * *